United States Patent
Lin et al.

(10) Patent No.: US 11,847,392 B1
(45) Date of Patent: Dec. 19, 2023

(54) METHOD, PRODUCT, AND SYSTEM FOR DYNAMIC DESIGN SWITCHING FOR HIGH PERFORMANCE MIXED SIGNAL SIMULATION

(71) Applicant: Cadence Design Systems, Inc., San Jose, CA (US)

(72) Inventors: Qingyu Lin, Pleasanton, CA (US); Patrick O'Halloran, Santa Rosa, CA (US); Xiao Wang, Beijing (CN)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/457,017

(22) Filed: Nov. 30, 2021

(51) Int. Cl.
*G06F 30/3308* (2020.01)
*G06F 30/367* (2020.01)
*G06F 30/38* (2020.01)
*G06F 30/398* (2020.01)

(52) U.S. Cl.
CPC ........ *G06F 30/3308* (2020.01); *G06F 30/367* (2020.01); *G06F 30/38* (2020.01); *G06F 30/398* (2020.01)

(58) Field of Classification Search
CPC .... G06F 30/3308; G06F 30/367; G06F 30/38; G06F 30/398
USPC ............... 716/106, 111, 136; 703/14, 15, 16
See application file for complete search history.

(56) References Cited

U.S. PATENT DOCUMENTS

| | | | |
|---|---|---|---|
| 7,392,170 B1* | 6/2008 | McGaughy | G06F 30/33 703/16 |
| 7,984,392 B2* | 7/2011 | Fu | G03F 1/36 716/54 |
| 9,218,440 B2* | 12/2015 | Mulvaney | G06F 30/3312 |
| 9,501,604 B1* | 11/2016 | More | G06F 30/331 |
| 10,521,197 B1* | 12/2019 | Ciolfi | G06F 8/34 |
| 10,783,296 B1* | 9/2020 | Ershov | G06F 30/327 |
| 2009/0172529 A1* | 7/2009 | Jas | G06F 11/261 703/14 |
| 2010/0185311 A1* | 7/2010 | Hsieh | G05B 19/02 700/121 |
| 2010/0242007 A1* | 9/2010 | Yoda | G06F 30/3323 716/108 |

(Continued)

FOREIGN PATENT DOCUMENTS

JP 09223167 A * 8/1997

OTHER PUBLICATIONS

Zaki, M., et al., "Formal Verification of Analog and Mixed Signal Designs: Survey and Comparison," IEEE, copyright 2006.

(Continued)

*Primary Examiner* — Phallaka Kik
(74) *Attorney, Agent, or Firm* — Vista IP Law Group, LLP

(57) ABSTRACT

An approach is disclosed herein for dynamic design switching for high performance mixed signal simulation. Disclosed herein is a new approach to simulation processes that allows for different segments of a design to be swapped out without requiring re-elaboration. This is an improvement over current techniques and decreases the amount of time need to simulate a design. In some embodiments, the technique illustrated herein is combined with an automated triggering mechanism that controls the selection of alternate representations for the same element base on those triggers. In some embodiments a new multiplexor structure is provided that is specifically tailored to solving the present issue.

20 Claims, 11 Drawing Sheets

(56) References Cited

U.S. PATENT DOCUMENTS

| | | | | |
|---|---|---|---|---|
| 2012/0246606 A1* | 9/2012 | Krauch | ............... | G06F 30/3312 |
| | | | | 716/113 |
| 2013/0263069 A1* | 10/2013 | Park | ...................... | G06F 30/327 |
| | | | | 716/104 |
| 2015/0199460 A1* | 7/2015 | Sundaresan | ............. | G06F 30/33 |
| | | | | 716/109 |
| 2015/0331981 A1* | 11/2015 | Mulvaney | ............. | G06F 30/392 |
| | | | | 716/134 |
| 2017/0249416 A1* | 8/2017 | Sendig | .................. | G06F 30/392 |
| 2017/0363679 A1* | 12/2017 | Sika | ...................... | G06F 30/367 |
| 2019/0236232 A1* | 8/2019 | Najibi | ................... | G06F 30/398 |
| 2023/0111082 A1* | 4/2023 | Hulse | ...................... | G06F 30/39 |
| | | | | 703/14 |
| 2023/0160957 A1* | 5/2023 | Cruz | ............... | G01R 31/31707 |
| | | | | 716/136 |

OTHER PUBLICATIONS

Leenaerts, D., et al., "CAD Solutions and Outstanding Challenges for Mixed-Signal and RF IC Design," San Jose CA, IEEE, dated Nov. 2001.

McConaghy, T., et al., "Automation in Mixed-Signal Design: Challenges and Solutions in the Wake of the Nano Era," IEEE/ACM International Conference on Computer-Aided Design, Digest of Technical Papers, Nov. 2006.

David, J., "Efficient Functional Verification for Mixed Signal IP," Cadence Design Systems, Inc, IEEE, dated Oct. 2004.

* cited by examiner

METHOD, PRODUCT, AND SYSTEM FOR DYNAMIC DESIGN SWITCHING FOR HIGH PERFORMANCE MIXED SIGNAL SIMULATION

FIELD

The present invention is directed to approaches for dynamic design switching for high performance mixed signal simulation.

BACKGROUND

Integrated circuits are constructed from multiple layers of metal and other materials that are placed on a substrate. For example, power and ground is distributed to different circuit elements using multiple different metal layers, vias, routing paths, and planes. Capacitors and transistors are created from various combinations of conducting, semiconducting, and insulating layers. The process of placing these elements (e.g., via deposition) creates these layers one on top of the other. However, before a design is manufactured into a physical product countless hours are spent designing, iterating, analyzing, and verifying that design in order to create something that will function as intended.

Verification itself can be very time consuming. The verification process is further complicated when designs include both analog and digital circuits. This is because analog circuits are more difficult to simulate and thus required more time to analyze and verify.

Current solutions to this issue allow for a user to provide different versions of a design for analysis. However, whenever those different versions are provided the processing for verification must be completed from scratch which requires re-elaboration and re-simulation of designs. Elaboration generally processes modules that have been compiled into a database to determine how to connect those modules based on a configuration, a setup specification, or a combination thereof. Re-elaboration requires that the elaboration process be repeated in order to account for any changes made. Re-simulation requires the simulation runs again with the new elaborated configuration. This is time consuming.

Thus, what is needed is an improved method, product, and system that avoids the issues associated with current techniques.

SUMMARY

Embodiments of the present invention provide an approach for dynamic design switching for high performance mixed signal simulation. Disclosed herein is a new approach to simulation processes that allows for different segments of a design to be swapped out or selected without requiring re-elaboration. This is an improvement over current techniques and decreases the amount of time need to simulate a design. In some embodiments, the technique illustrated herein is combined with an automated triggering mechanism that controls the selection of alternate representations for the same element base on those triggers. In some embodiments a new multiplexor structure is provided that is specifically tailored to solving the present issue.

Other additional objects, features, and advantages of the invention are described in the detailed description, figures, and claims.

BRIEF DESCRIPTION OF FIGURES

In order that the present invention is better understood, some embodiments of the invention will now be described, by way of example only, with reference to the accompanying drawings.

DETAILED DESCRIPTION

Embodiments of the present invention provide an approach for a method, product, and system for dynamic design switching for high performance mixed signal simulation.

Various embodiments are described hereinafter with reference to the figures. It should be noted that the figures are not necessarily drawn to scale. It should also be noted that the figures are only intended to facilitate the description of the embodiments and are not intended as an exhaustive description of the invention or as a limitation on the scope of the invention. In addition, an illustrated embodiment need not have all the aspects or advantages shown. An aspect or advantage described in conjunction with a particular embodiment is not necessarily limited to that embodiment and can be practiced in any other embodiments even if not so illustrated.

Figure 1:
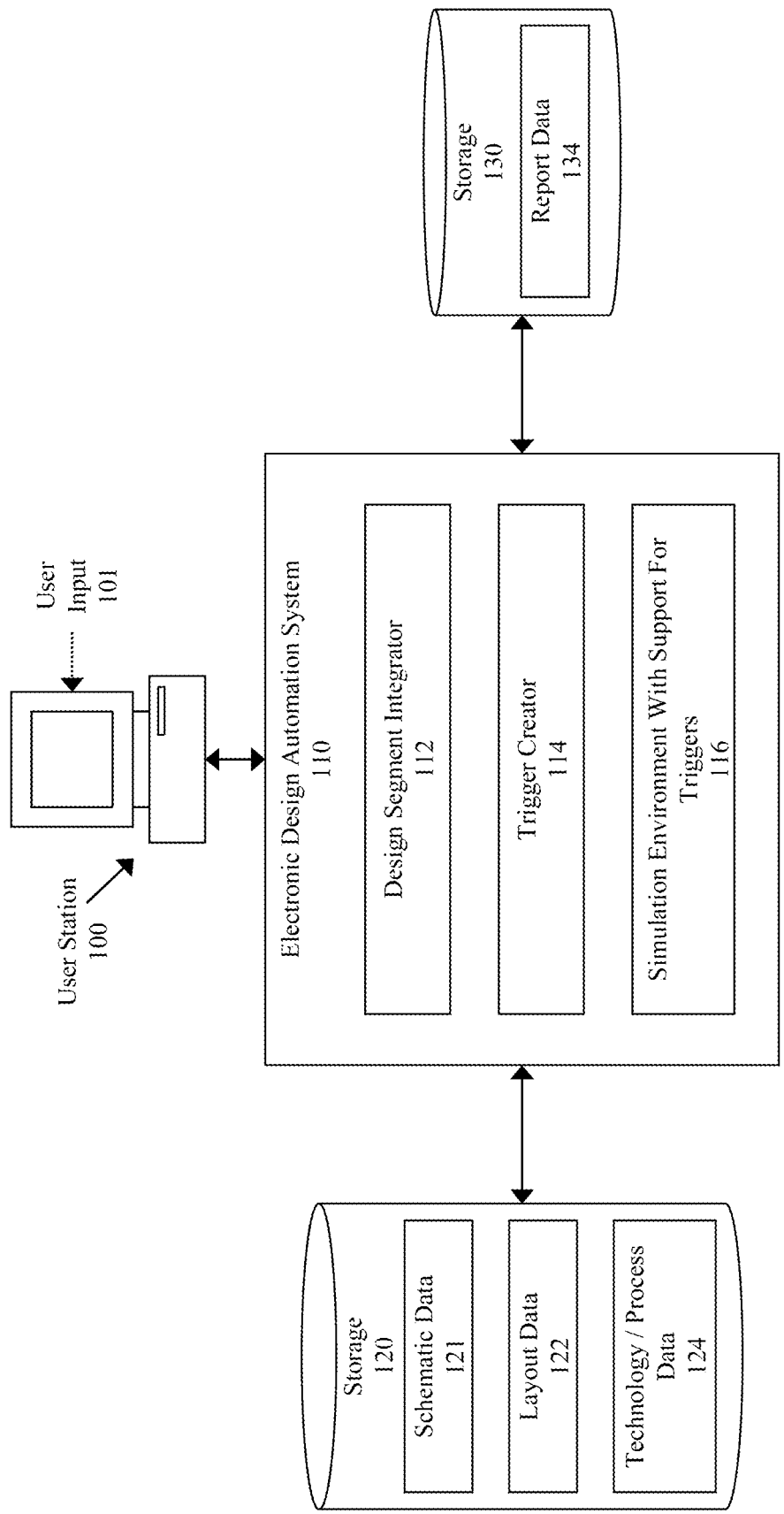
FIG. 1 illustrates an example arrangement for dynamic design switching for high performance mixed signal simulation according to some embodiments.

FIG. 1 illustrates an example arrangement for dynamic design switching for high performance mixed signal simulation according to some embodiments. Generally, the process operates on a schematic or layout to select different representations of the same segment of a design. This selection allows a user to utilize representations that have varying levels of accuracy which are tailored to then current goals.

As illustrated, FIG. 1 includes a user station 100, storage 120 and 130, and electronic design automation system 110. Each are discussed in turn below.

In some embodiments, the user station 100 includes or provides access to the electronic design automation system 110 and the setup and use of the electronic design automation system (EDA system) for simulation of a design. For instance, the electronic design automation system 110 might be located on the user station 100, on a remote device accessed by the user station, or distributed across multiple devices (in a private network, private cloud, or public cloud). The user station 100 causes the execution of a process to simulate the design including identification of different representations of respective design segments and conditions that trigger the selection of one of those representations. The user station 100 comprises any type of computing station that is useable to operate or interface with a database (e.g., 120 and/or 130). Examples of such user stations include workstations, personal computers, or remote computing terminals. In some embodiments, the user station 100 comprises a display device, such as a display monitor, for displaying a user interface to any users at the user station. The user station 100 also comprises one or more input devices for the user to provide operational control over the user station, such as a mouse or keyboard to manipulate a pointing object in a graphical user interface from which a user input 101 might be received.

The electronic design automation system 110, as illustrated, includes a design segment integrator 112, a trigger creator 114, and a simulation environment with support for triggers 116. In some embodiments, the design segment integrator 112, the trigger creator 114, and the simulation environment with support for triggers 116 can be provided separately or together or in any combination thereof. In some embodiments, the various components, or the functions, of the electronic design automation system 110 are combined or separated into different components from those illustrated. In some embodiments, the electronic design automation system is implemented within a cloud computing platform and may utilize one or more resources of the cloud. In some embodiments, the cloud computing system is provided by a third party to a user, where the user uses a user station (e.g., user station 100) to connect to the cloud computing system and to control the operations of the electronic design automation system. In some embodiments, only a portion of the electronic design automation system is provided on the cloud system, such as the design segment integrator 112, the trigger creator 114, or the simulation environment with support of triggers 116. In some embodiments, any combination of storage 120 and/or 130, or portions thereof, are provided by, or connected to, the cloud computing system. In some embodiments, the EDA system and simulation environment operate on schematic data or layout data, or a combination thereof.

The design segment integrator 112 provides for integration of the different representations for the same segment. Details of this process will be discussed further below. Briefly, the process may operation by identifying the segments having different representations, identification of ports, inputs, outputs, and supply connections, insertion of one or more multiplexors to enable selection of the different representations, and creation of control signals for respective representations. In this way the design segment integrator can generate or modify a design such that different representations for respective segments can be selected at any given time without requiring re-elaboration and re-simulation.

The trigger creator 114 is used to create rules that can be evaluated to determine when a particular representation should be selected or changed using one or more control signals. For example, triggers could be hard coded time points, isolation rules, based on one or more signals, or specified in a hardware description language of the design. In this way, any number of conditions can be identified. Furthermore, any trigger could be conditioned on any other trigger being satisfied such each trigger may also comprise a combination of the coded time points, the isolation rules, based on the one or more signals, or specification in the hardware description language of the design.

The simulation environment with support of triggers 116 can execute a simulation or circuit verification in a process that will honor the specified triggers by driving the respective control signals to the corresponding value. In particular, when a triggering event occurs the simulator can change the corresponding signals. The corresponding signals will cause the selection of a particular representation of a segment of the design. For example, a trigger may be set after a settle time required for an analog clock circuit to cause the selection of a representation that is either a digital circuit or a representative model (e.g., a real number modeling circuit).

The system includes a database 120 which as illustrated includes schematic data 121, layout data 122, and technology/process data 124, and database 130 which as illustrated includes reporting data 134. In some embodiments, the database 120 and 130 comprises a single database with one or more subsets within the database for the different types of data as illustrated in FIG. 1. However, in some embodiments the database comprises multiple separate databases on different computing systems and/or in different locations connected via electronic communication links (e.g., wired and/or wireless networks). The system may further include a database access module(s) (e.g., at user state 100 or in the EDA system 110) for accessing and storing relevant data, whether stored at a single database or at multiple databases.

The schematic data 121 comprises any type of representations of a schematic of a circuit design. For instance, the design data comprises any one or more of a hardware descriptive language design, a circuit schematic design, netlist, or any combination thereof. The layout data 122 comprises any types of representations of a physical form of a circuit design. For instance, the layout data comprises a circuit layout consisting of a plurality of shapes on a plurality of layers.

The technology/process data 124 comprises any relevant process parameters for a target node of a given design. Generally, the technology/process data 124 can be used to generate a physical design that is compliant with the relevant technology/process data.

The report data 134 might indicate whether any violations, errors, warnings, or other failures are identified during the simulation and the corresponding design elements. Additional report data 134 might also indicate which portion or portions of the design passed relevant checks.

Figure 2:
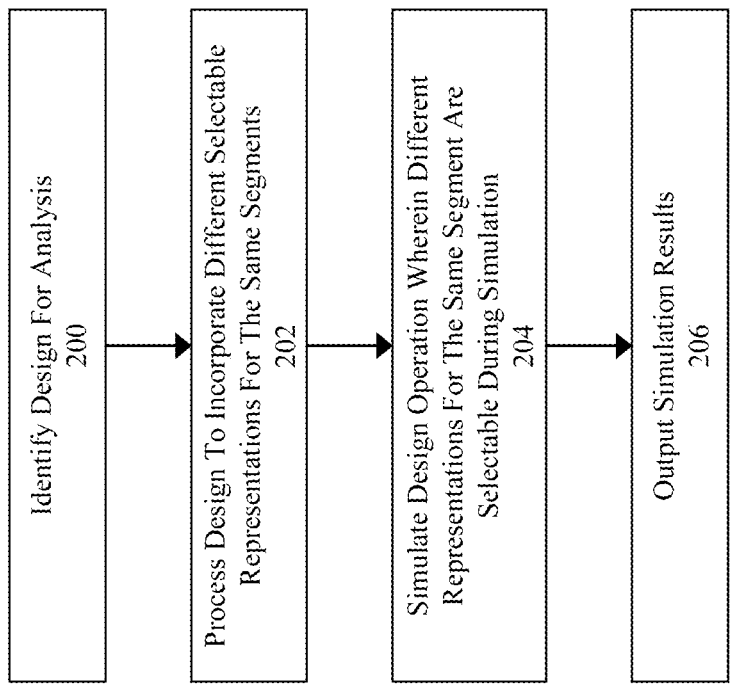
FIG. 2 illustrates a flow for dynamic design switching for high performance mixed signal simulation according to some embodiments.

FIG. 2 illustrates a flow for dynamic design switching for high performance mixed signal simulation according to some embodiments. Generally, the flow modifies a design such that different segments of that design have two or more versions that can be selected by a switching mechanism to enable simulation without re-elaboration.

The process starts at 200 where a design for analysis is identified. This might occur via any of multiple ways such as when a user selects a design for processing, based on an already open design, based on a work group or project assignment.

At 202 the identified design is processed to incorporate different selectable representations for the same segment.

These approaches might be implemented using a low power design approach that provides for isolation at the level of a simulation or via one or more multiplexor elements on inputs, outputs, power, ground, or control signals (e.g., at a port or supply connection). Respective embodiments will be discussed further below herein.

Once the design is modified at 202 to incorporate the different selectable representations for the same segments, at 204 the process will simulate design operation wherein the different representations for the same segment are selectable during simulation without re-elaboration being required. Briefly, the approach operates by simulating the design where one or more triggers may cause the selected of a different representation from one already selected for a given segment. Further details and discussion are provided below.

Finally, at 206 results of the simulation are provided. These results may be provided using any appropriate approach such as via a stream of errors or warnings, a set of timing closure information, a functional report, a series of states, one or multiple waveform databases, or any combination thereof.

Figure 3:
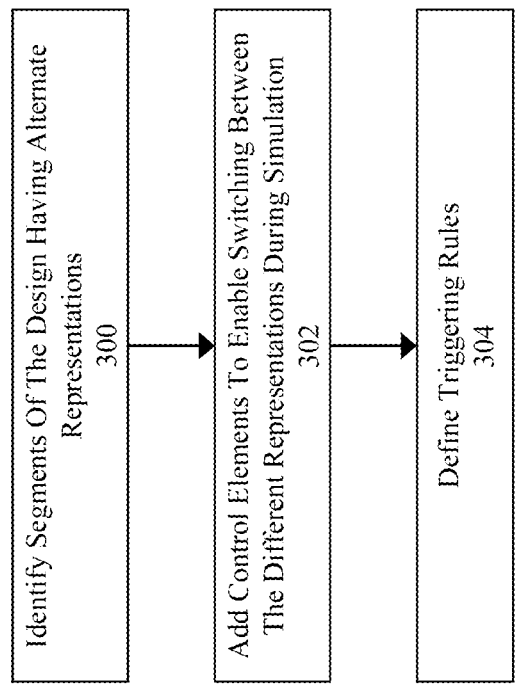
FIG. 3 illustrates an example flow for processing a design to incorporate different selectable representations for the same segment according to some embodiments.

FIG. 3 illustrates an example flow for processing a design to incorporate different selectable representations for the same segment according to some embodiments. Incorporation of different selectable representations for the same segment essentially comprises three steps, identification of the segments having alternate representations, adding a mechanism to control selected of different representations, and defining when a respective representation is selected.

The flow starts at 300 wherein the different design segments are identified. These may be provided by an engineer directly, may be identified within a database having different representations for the same segment at one or more different levels of granularity (e.g., a behavior model level, a real number model level, a hardware description level, a register-transfer level, or a physical layout level). In some embodiments, each segment having alternate representations may be identified to a user for selection and control thereof as to which level or levels should be utilized. For example, a user might identify all real number model level representations as alternates along with the register-transfer level for representation whether alone or in combination with all analog circuits, all timing circuits, all memory circuits, or any combination thereof.

At 302 all the representations selected for each segment art integrated within the design. This will be discussed further below. Briefly, this may be accomplished using low power design tools and power domains, using switching elements (e.g., multiplexors), or a combination there.

At 304 one or more triggers are specified for controlling the selection of different representations. Triggering is discussed further below and may include any combination of different triggers such as hard coded time based triggers, isolation rule based triggers, triggers based on one or more signals in the design, or triggers that correspond to a hardware description language.

Figure 4A:
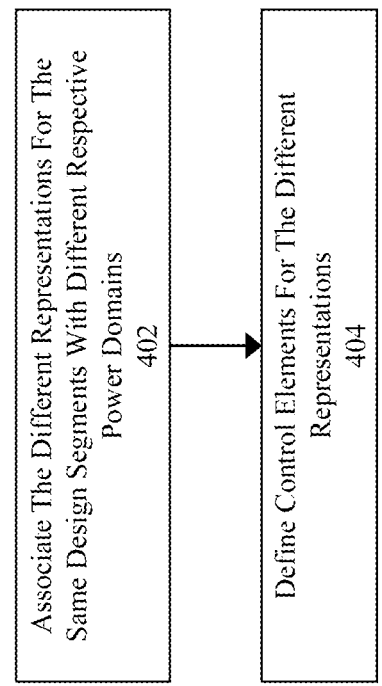
FIGS. 4A-4B illustrate example flows for adding control elements to enable switching between the different representations during simulation according to some embodiments.
Figure 4B:
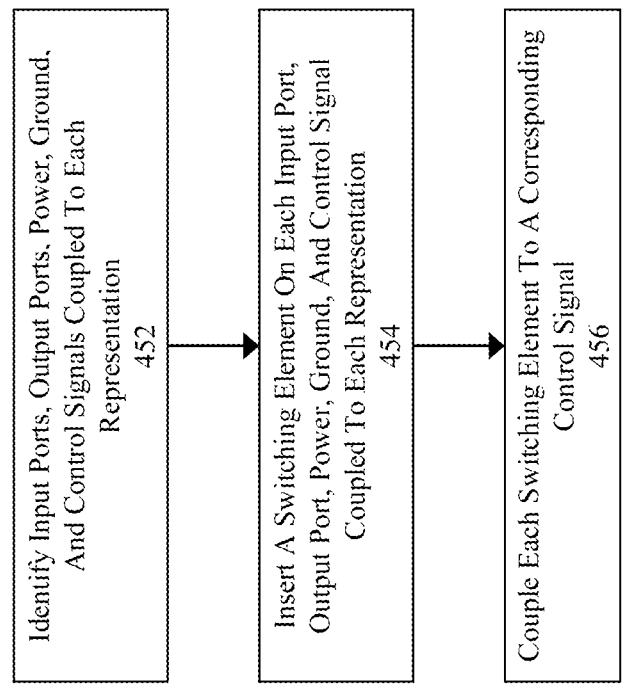

FIGS. 4A-4B illustrate example flows for adding control elements to enable switching between the different representations during simulation according to some embodiments.

FIG. 4A illustrates an example flow for adding control elements to enable switching between the different representations during simulation using low power domain techniques according to some embodiments.

The process starts at 402 where different representations for the same segment are associated with different power domains. In this way, the simulation can control the selection, and inversely the isolation, of different representations for the same segment using power domain control tools without requiring re-elaboration.

At 404 the low power domains system can define control elements for different representations by adding circuity to enable and disable the circuits elements for the different representations. In essence, this will create different power domains that will correspond to one representation but not another representation for the same segment.

FIG. 4B illustrates an example flow for adding control elements to enable switching between the different representations during simulation switching elements according to some embodiments.

The process starts at 452 where connections with a segment are identified. For example, the approach identifies input ports, output ports, power, ground, and control signals coupled to each representation that has an alternate representation that is to be selectable.

At 454 a switching element is inserted on each input port, output port, power, ground, and control signal coupled to each representation. Once a switching element has be inserted at each of those locations, the process will couple those switching elements to one or more control signals at 456. In some embodiments, each control signal will select one representation or another representation—e.g., two representations are provided and the control element will select one or the other. In some embodiments, more than two representations may be provided and different control signals will be provided using a one hot encoding. In some embodiments, multiple control signals are used to selected from a plurality of different representations for the same segment.

Figure 5:
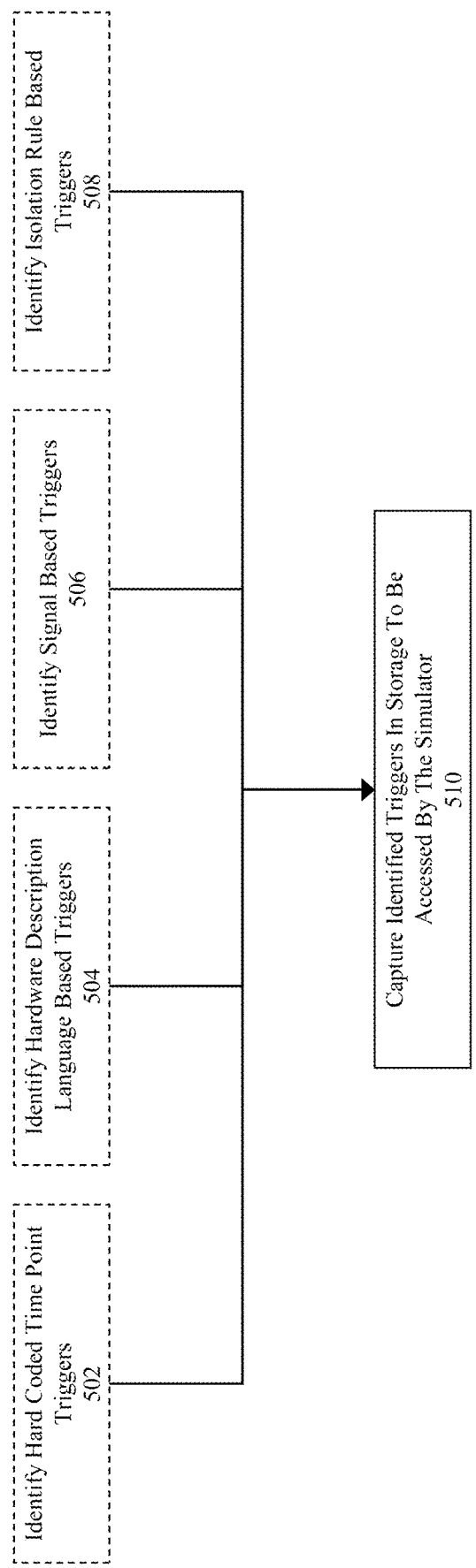
FIG. 5 illustrates an example flow for defining triggering rules according to some embodiments.

FIG. 5 illustrates an example flow for defining triggering rules according to some embodiments. Any combination of triggering rules may be used, and any combination of default or user defined rules may be generated.

Identified triggers are captured and stored in a storage area accessible to a simulator or to be provided to a simulator see 510. The triggers may be defined using hard coded time point triggers at 502. For instance, a hard coded time point trigger might be used for a clock circuit after a specified amount of time has passed, after which the clock signal is presumed to be stable. A hardware description language based trigger might be provided at 504. For example, hardware description based triggers might correspond to one or more function calls that are evaluated when a function is called or when a function returns a value. A signal based triggering rule might be identified at 506. Signal based triggering rules are based on a state of a given signal or set of signals (e.g., based on a given value or set of values). An isolation rule based trigger might be defined at 504. Wherein the isolation rule maps any of other types of triggers to a rule that is dependent on an isolation rule. Each trigger is also mapped to a specific action to be take, such as selection of different/specific representation or modification of a power domain.

Figure 6:
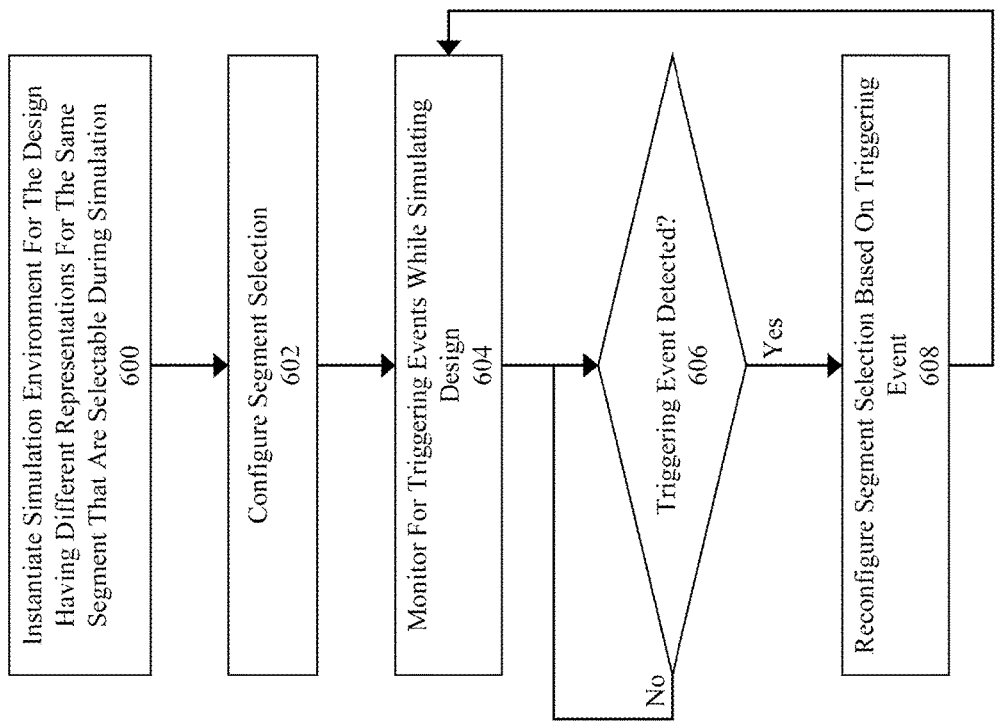
FIG. 6 illustrates an example flow for simulating design operation wherein different representations for the same segment are selected during simulation according to some embodiments.

FIG. 6 illustrates an example flow for simulating design operation wherein different representations for the same segment are selected during simulation according to some embodiments.

The simulation process starts at 600 when a simulation environment is instantiated for the design having different representations for the same segment that are selectable during simulation. Generally, the approach incorporates a simulation environment with the previously discussed triggers and modified design having the alternate representations.

Once the simulation environment is instantiated, the process configures the segment(s) select at 602. In particular, the power domains, the control signals to select different segments, or some combination thereof are configured for initial simulation. This might comprise a default segment selection (e.g., selecting the design levels having the highest level of details) which may or may not be modified or entirely overridden by a user.

At 604 the design simulation process is monitored during operation to identify any triggering events. For example, an action or sequence of actions might be selected for input into the design and the design is simulated in response to the action or sequence of actions. At 606 an evaluation is performed to determine whether a triggering event has been detected. If no triggering event is detected the process merely loops, by repeatedly evaluating relevant triggers when any conditions or signal changes that is used as a basis for a trigger. In some embodiments, the conditions might comprise a period of operation, a trigger corresponding to a hardware description language function call, a trigger corresponding to a signal value, an isolation rule based trigger, or any combination thereof.

When a triggering event is detected, the process continues at 608 where the design is reconfigured in response to the triggering event. For example, a triggering event is identified in response to a stable clock signal being generated for 10 cycles based on a phase lock loop lock signal, where the triggering event causes a determination of which segment should be selected—e.g., selection of an analog version or a real number model version of a segment. Such models may be accurate enough for the simulation of the design at that stage (e.g., once a clock signal has settled), but cheaper for the simulation from a computation perspective. Thus, improving the function of the electronic design automation system. After the reconfiguration, the simulation continues with the execution and monitoring of the simulation for additional triggering events (see 604).

Figure 7:
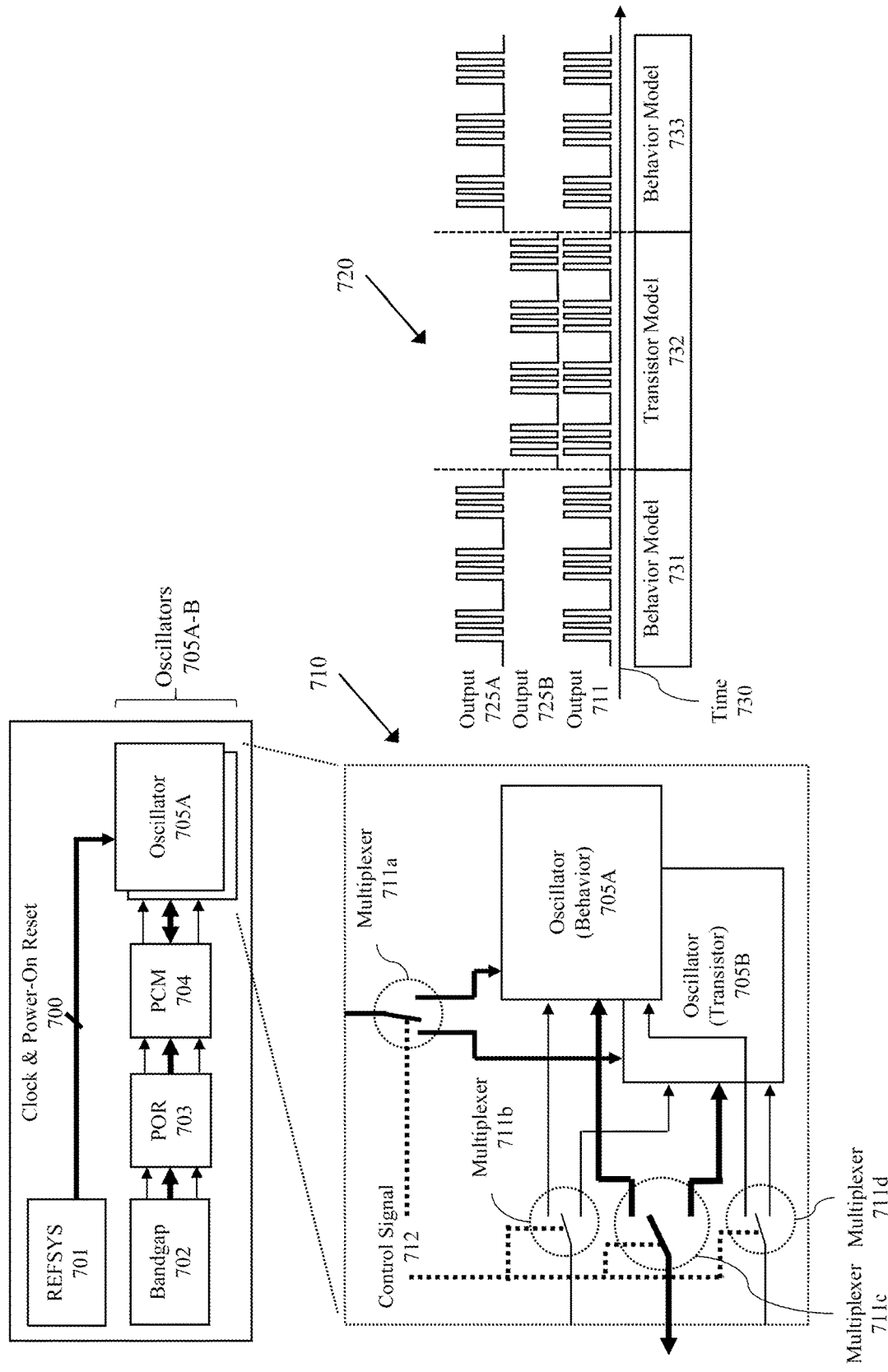
FIG. 7 illustrates an example arrangement for a clock and power-on reset circuit having two different selectable representations for the same segment according to some embodiments.

FIG. 7 illustrates an example arrangement for a clock and power-on reset circuit having two different selectable representations for the same segment according to some embodiments.

The illustrated clock and power-on reset circuit (see 700) is provided as an example only and is not intended to limit the application of the present invention. The clock and power-on reset circuit includes a reference system value 701, a bandgap filter 702, a power on reset circuit 703, a process control monitor 704, and an oscillators 705A-B.

Each of Oscillators 705A and 705B comprise different representations for the same segment, where 705A is a behavior model and 705 is a transistor model. As illustrated at 710 each of the models may be selected using one or more switching mechanisms. For example, on each connection of the respective oscillators a multiplexor is inserted (see multiplexors 711*a*-*d*) having in this case a single corresponding control signal 712 which selects between the behavior model 705A and the transistor model 705B for the oscillator segment.

The effect of this is illustrated by the timing diagram 720, where an output of a single multiplexor is illustrated as 711 over time 730 and is based on the different models during different time periods. Specifically, a first time period 731 corresponds to the behavior model (see 725A) and a second time period 732 corresponds to the transistor model (see 725B), with time period 733 again corresponds to the behavior model (see 725A).

Figure 8:
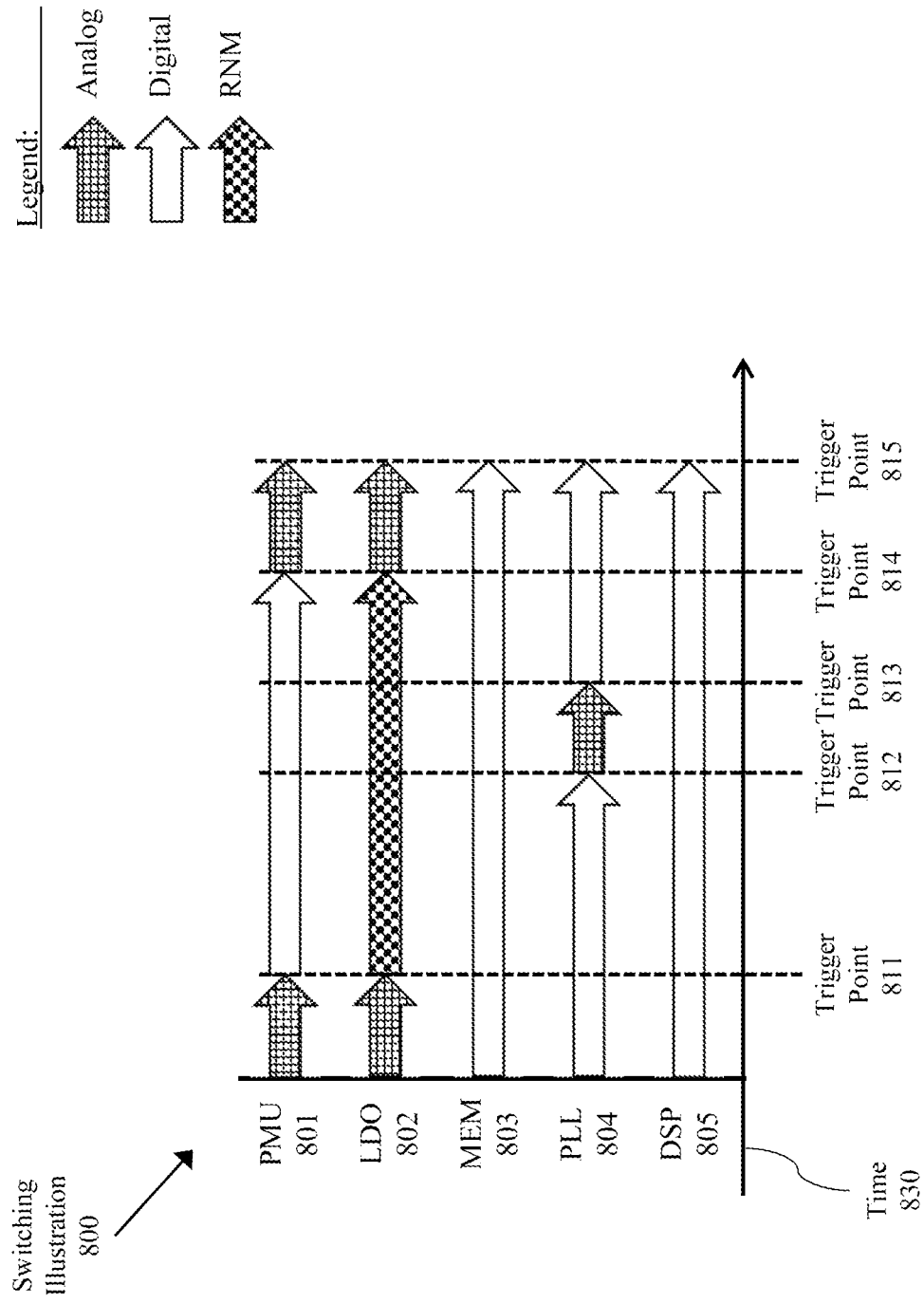
FIG. 8 illustrates a sequence of switching events according to some embodiments.

FIG. 8 illustrates a sequence of switching events according to some embodiments. As provided in this illustration a representation might comprise analog, digital, or real number models.

Switching illustration 800 is divided into a sequence of time periods, an initial time period to trigger point 811, a second time period from trigger point 811 to trigger point 812, a third time period from trigger point 812 to trigger point 813, a fourth time period from trigger point 813 to trigger point 814, and a fifth time period from trigger point 814 to trigger point 815. At the boundary of each time period one or more triggering events occur that cause the selection of the different representation for the same segment as indicated.

For example, the power management unit (see PMU 801) might be represented by an analog circuit during the first and fifth time periods and a digital circuit during the second through fourth periods, the low dropout regulator (see LDO 802) might be represented by an analog circuit during the first and fifth time periods and a real number model during the second through fourth periods. The memory (see MEM 803) and digital signal processor (see DSP 805) might be represented by a digital circuit during all the time periods. Finally, a phase lock loop (see PLL 804) might be represented as a digital circuit during all but the third time period where it is represented by an analog circuit.

Figure 9:
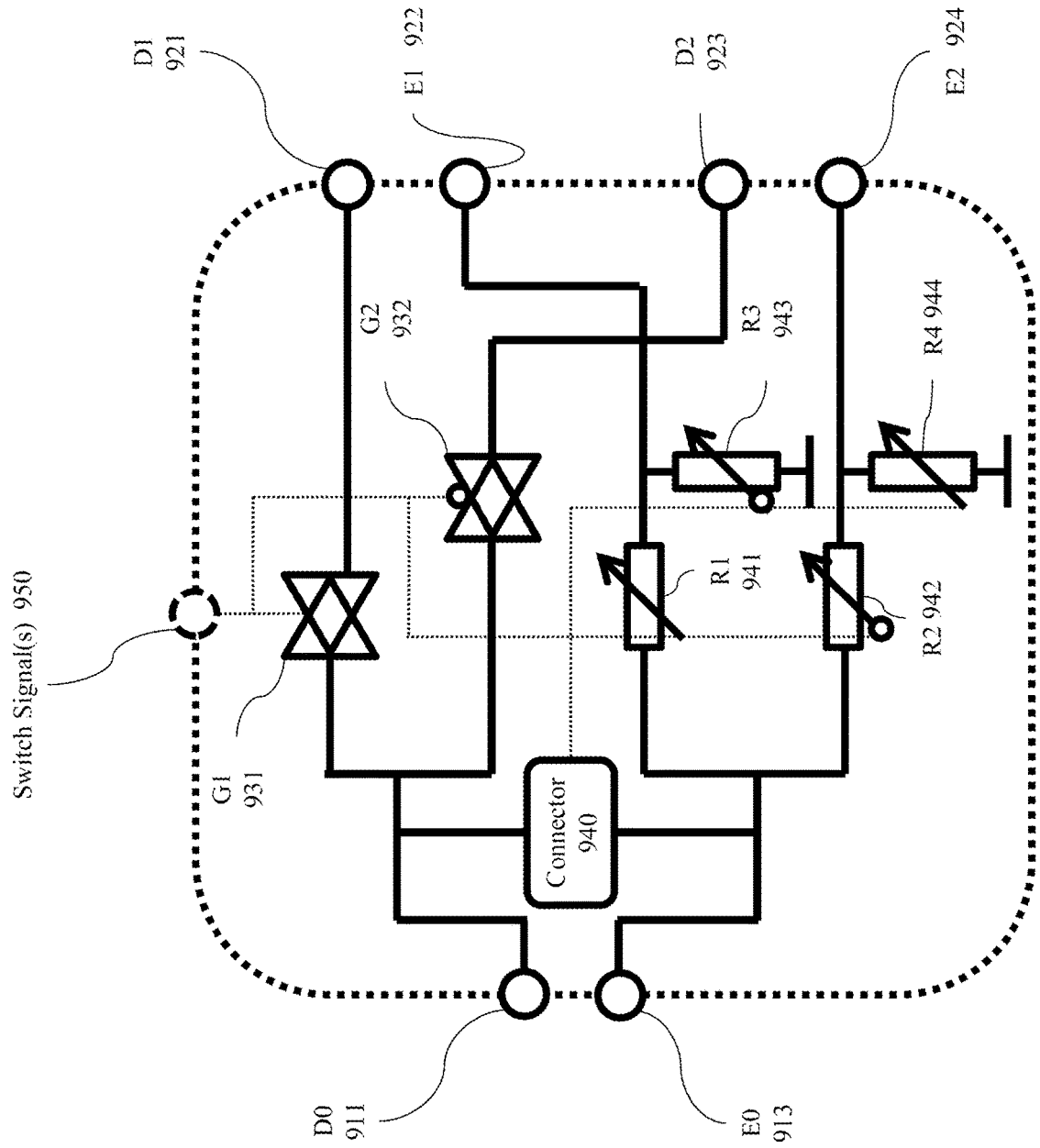
FIG. 9 illustrates a multiplexor that is particularly tailored to the selection of segment representations according to some embodiments.

FIG. 9 illustrates a multiplexor that is particularly tailored to the segment representation selection according to some embodiments.

The multiplexor illustrated in FIG. 9 includes two inputs and four outputs and a connector between inputs to allow for switching between domains (e.g., digital and analog). For example, D0 (see 911) can be routed though gate G1 (see 931) to digital output D1 (see 921) or though gate G2 (see 932) to digital output D2 (see 923). Similarly, E0 (see 913) can be routed though variable resistors R1 (see 941) to analog output E1 (see 922) or though variable resistor R2 (see 942) to Analog output E2 (see 924). Additionally, each of D0 and E0 can be routed through connector 940 to cross to a different domain (e.g., analog to digital or digital to analog).

Each gate can be controlled to allow a signal to pass through with little to no effect on the signal or to block a signal from passing through. Similarly, each variable resistor can be set to allow a signal to pass or to block the signal from passing. However, here two variable resistors work together to allow a signal to pass. For example, to pass a signal to E1, R1 will be set to a very low resistance while R3 is set to a very high resistance and to pass a signal to E2, R2 will be set to a very low resistance while R4 is set to a very high resistance. To block a signal from being passed the relationship between R1 and R3 or R2 and R4 is reversed.

To pass a signal from the analog to digital domain or vice versa the connector 940 is utilized. In some embodiments, only one of the inputs is connected and the connector 940 is always enabled. In some embodiments, both inputs may be connected but only one of those inputs is actually driven. Finally, in some embodiments, multiple control signals are provided (see switch signals 950). In this way the multiplexor allows utilization of different representations for the same circuit element without requiring re-elaboration.

Generally, a single signal can be used to control the output of the multiplexor. This is because the EDA system will know what type of input is being provide (digital or analog)

and what type of output is being provided (digital or analog). For example, to connect a digital input to any of two digital outputs (e.g., D0 to D1 or D2) the connector 940 can be disabled, and the control signal 950 can be used to select either D1 or D2. To connect an analog input to any of two analog output outputs (e.g., E0 to E1 or E2) the connector 940 can be disabled, and the control signal 950 can be used to select either E1 or E2. To connect a digital input to any of two analog outputs (e.g., D0 to E1 or E2) the connector 940 is enabled, and the control signal 950 can be used to select either E1 or E2. To connect an analog input to any of two digital outputs (e.g., E0 to D1 or D2) the connector 940 is enabled, and the control signal 950 can be used to select either E1 or E2.

System Architecture Overview

Figure 10:
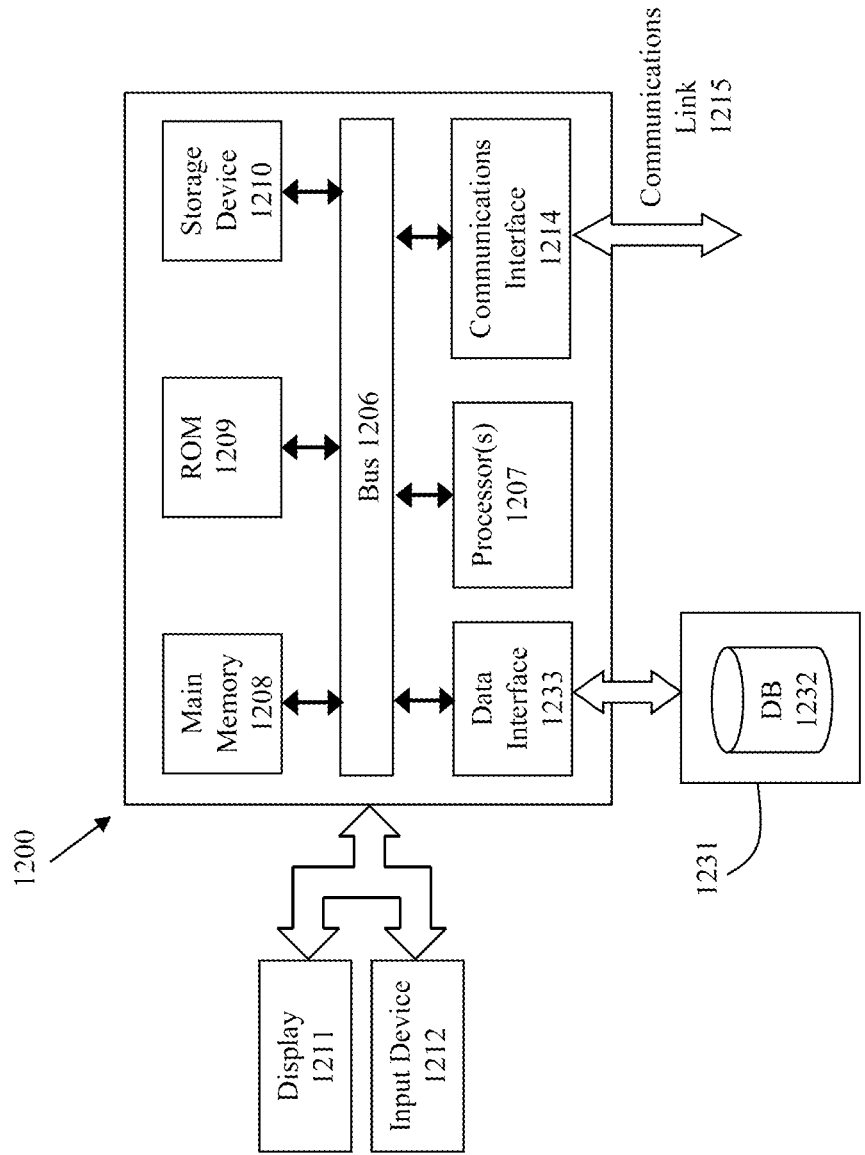
FIG. 10 shows an architecture of an example computing system with which the invention or parts of the invention may be implemented.

FIG. 10 shows an architecture of an example computing system with which the invention may be implemented. Computer system 1200 includes a bus 1206 or other communication mechanism for communicating information, which interconnects subsystems and devices, such as processor 1207, system memory 1208 (e.g., RAM), static storage device 1209 (e.g., ROM), disk drive 1210 (e.g., magnetic or optical), communication interface 1214 (e.g., modem or Ethernet card), display 1211 (e.g., CRT or LCD), input device 1212 (e.g., keyboard), and cursor control.

According to one embodiment of the invention, computer system 1200 performs specific operations by processor 1207 executing one or more sequences of one or more instructions contained in system memory 1208. Such instructions may be read into system memory 1208 from another computer readable/usable medium, such as static storage device 1209 or disk drive 1210. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1207 for execution. Such a medium may take many forms, including but not limited to, non-volatile media and volatile media. Non-volatile media includes, for example, optical or magnetic disks, such as disk drive 1210. Volatile media includes dynamic memory, such as system memory 1208.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1200. According to other embodiments of the invention, two or more computer systems 1200 coupled by communication link 1215 (e.g., LAN, PTSN, or wireless network) may perform the sequence of instructions required to practice the invention in coordination with one another.

Computer system 1200 may transmit and receive messages, data, and instructions, including program, e.g., application code, through communication link 1215 and communication interface 1214. Received program code may be executed by processor 1207 as it is received, and/or stored in disk drive 1210, or other non-volatile storage for later execution. Computer system 1200 may communicate through a data interface 1233 to a database 1232 on an external storage device 1231.

Therefore, what has been described herein an improvement to EDA tools used to design semiconductor devices that improves the processes and results of those processes for verification and analysis. The approaches disclosed herein improves the ability of the EDA tools to reproduce reliable results in a timely manner by improving the ability of the tools to be tailored to a particular verification process or area of focus according to the embodiments disclosed.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method, comprising:
identifying an integrated circuit design for analysis, the integrated circuit design having a plurality of segments;
processing the integrated circuit design to incorporate different selectable representations for a respective segment of the plurality of segments at least by adding one or more control elements to the integrated circuit design, wherein the one or more control elements enable switching between different representations of the respective segment during simulation; and
simulating operation of the integrated circuit design, wherein the different representations for the respective segment is selectable during simulation by controlling the one or more control elements to switch between the different representations of the respective segment.

2. The method of claim 1, wherein processing the integrated circuit design to incorporate different selectable representations for the respective segment further comprises:
identifying segments of the plurality of segments of the integrated circuit design having alternate representations; and
defining one or more triggering rules.

3. The method of claim 2, wherein alternate representations for the respective segment are associated with different power domains.

4. The method of claim 2, wherein the one or more control elements are added on at least one input port, output port, power port, ground port, or control port coupled to the different representations of the respective segment; and
further comprising coupling each control element to a corresponding control signal.

5. The method of claim 1, wherein the different representations for the respective segment is selectable during simulation based on one or more triggering rules stored in a database accessible to the simulator.

6. The method of claim 5, wherein the one or more triggering rules comprise a hard coded time point trigger, a hardware description language based trigger, a signal based trigger, an isolation rule based trigger, or a combination thereof.

7. The method of claim 1, wherein the different representations for the respective segment comprise two or more of an analog circuit representation, a digital circuit representation, or a real number model representation.

8. A non-transitory computer readable medium having stored thereon a sequence of instructions which, when executed by a processor performs a set of acts, the set of acts comprising:
identifying an integrated circuit design for analysis, the integrated circuit design having a plurality of segments;
processing the integrated circuit design to incorporate different selectable representations for a respective segment of the plurality of segments at least by adding one or more control elements to the integrated circuit design, wherein the one or more control elements enable switching between different representations of the respective segment during simulation; and
simulating operation of the integrated circuit design, wherein the different representations for the respective segment is selectable during simulation by controlling the one or more control elements to switch between the different representations of the respective segment.

9. The non-transitory computer readable medium of claim 8, wherein processing the integrated circuit design to incorporate different selectable representations for the respective segment further comprises:
identifying segments of the plurality of segments of the integrated circuit design having alternate representations; and
defining one or more triggering rules.

10. The non-transitory computer readable medium of claim 9, wherein alternate representations for the respective segment are associated with different power domains.

11. The non-transitory computer readable medium of claim 9, wherein the one or more control elements are added on at least one input port, output port, power port, ground port, or control port coupled to the different representations of the respective segment; and
the set of acts further comprising coupling each control element to a corresponding control signal.

12. The non-transitory computer readable medium of claim 8, wherein the different representations for the respective segment is selectable during simulation based on one or more triggering rules stored in a database accessible to the simulator.

13. The non-transitory computer readable medium of claim 12, wherein the one or more triggering rules comprise a hard coded time point trigger, a hardware description language based trigger, a signal based trigger, an isolation rule based trigger, or a combination thereof.

14. The non-transitory computer readable medium of claim 8, wherein the different representations for the respective segment comprise two or more of an analog circuit representation, a digital circuit representation, or a real number model representation.

15. A computing system, comprising:
memory having a set of instructions; and
a processor that executes the set of instructions to perform a set of acts, the set of acts comprising:
identifying an integrated circuit design for analysis, the integrated circuit design having a plurality of segments;
processing the integrated circuit design to incorporate different selectable representations for a respective segment of the plurality of segments at least by adding one or more control elements to the integrated circuit design, wherein the one or more control elements enable switching between different representations of the respective segment during simulation; and
simulating operation of the integrated circuit design, wherein the different representations for the respective segment is selectable during simulation by controlling the one or more control elements to switch between the different representations of the respective segment.

16. The computing system of claim 15, wherein processing the integrated circuit design to incorporate different selectable representations for the respective segment further comprises:
identifying segments of the plurality of segments of the integrated circuit design having alternate representations; and
defining one or more triggering rules.

17. The computing system of claim 16, wherein alternate representations for the respective segment are associated with different power domains.

18. The computing system of claim 16, wherein the one or more control elements are added on at least one input port, output port, power port, ground port, or control port coupled to the different representations of the respective segment; and
the set of acts further comprising coupling each control element to a corresponding control signal.

19. The computing system of claim 15, wherein the different representations for the respective segment is selectable during simulation based on one or more triggering rules stored in a database accessible to the simulator.

20. The computing system of claim 19, wherein the one or more triggering rules comprise a hard coded time point trigger, a hardware description language based trigger, a signal based trigger, an isolation rule based trigger, or a combination thereof.

* * * * *